United States Patent [19]

Corradetti et al.

[11] Patent Number: 5,011,246

[45] Date of Patent: Apr. 30, 1991

[54] HOUSING FOR AN OPTO-ELECTRONIC DEVICE

[75] Inventors: Anthony A. Corradetti, Brookhaven, Pa.; Edward P. Gargiulo, Wilmington, Del.; Leland L. Krauss, Glenmoor, Pa.; Robert W. Hooley, Ipswich, England

[73] Assignee: E. I. Du Pont de Nemours and Company, Wilmington, Del.

[21] Appl. No.: 544,794

[22] Filed: Jun. 29, 1990

Related U.S. Application Data

[63] Continuation of Ser. No. 354,530, May 19, 1989, abandoned.

[51] Int. Cl.$^5$ .............................................. G02B 6/42
[52] U.S. Cl. ................................................. 350/96.2
[58] Field of Search .................. 350/96.2, 96.21, 96.22

[56] References Cited

U.S. PATENT DOCUMENTS

| | | | |
|---|---|---|---|
| 4,149,072 | 4/1979 | Smith et al. | 250/199 |
| 4,427,879 | 1/1984 | Becher et al. | 250/215 |
| 4,625,333 | 11/1986 | Takezawa et al. | 455/612 |
| 4,715,675 | 12/1987 | Kevern et al. | 350/96 |
| 4,733,934 | 3/1988 | Wais et al. | 350/96 |
| 4,737,008 | 4/1988 | Ohyama et al. | 350/96 |
| 4,759,599 | 7/1988 | Yamaguchi et al. | 350/96 |
| 4,762,388 | 8/1988 | Tanaka et al. | 350/96 |
| 4,772,081 | 9/1988 | Borgos et al. | 350/96 |
| 4,787,706 | 11/1988 | Cannon, Jr. et al. | 350/96 |

FOREIGN PATENT DOCUMENTS 58-192011  11/1983  Japan ................................. 350/96.2

*Primary Examiner*—John D. Lee
*Assistant Examiner*—John Ngo

[57] ABSTRACT

A housing for interconnecting an opto-electronic device with a ferrule includes a base, a cover cooperable with the base to define a chamber, and a mounting member is characterized by a pivot arrangement disposed on the mounting member and cooperating with at least one of the base or the cover for accommodating pivotal motion of the mounting member to permit the axis of the mounting member to translate in two orthogonal directions in a plane perpendicular to the axis of the chamber and also to permit the top of the mounting member to displace in the perpendicular plane to align the axis of the mounting member collinearly with the axis of the ferrule. The housing also includes an elastomeric board mount disposed in a sealing relationship between the base and the cover when the same are conjoined and arranged to seal legs on a substrate that extend through the elastomeric board mount.

38 Claims, 8 Drawing Sheets

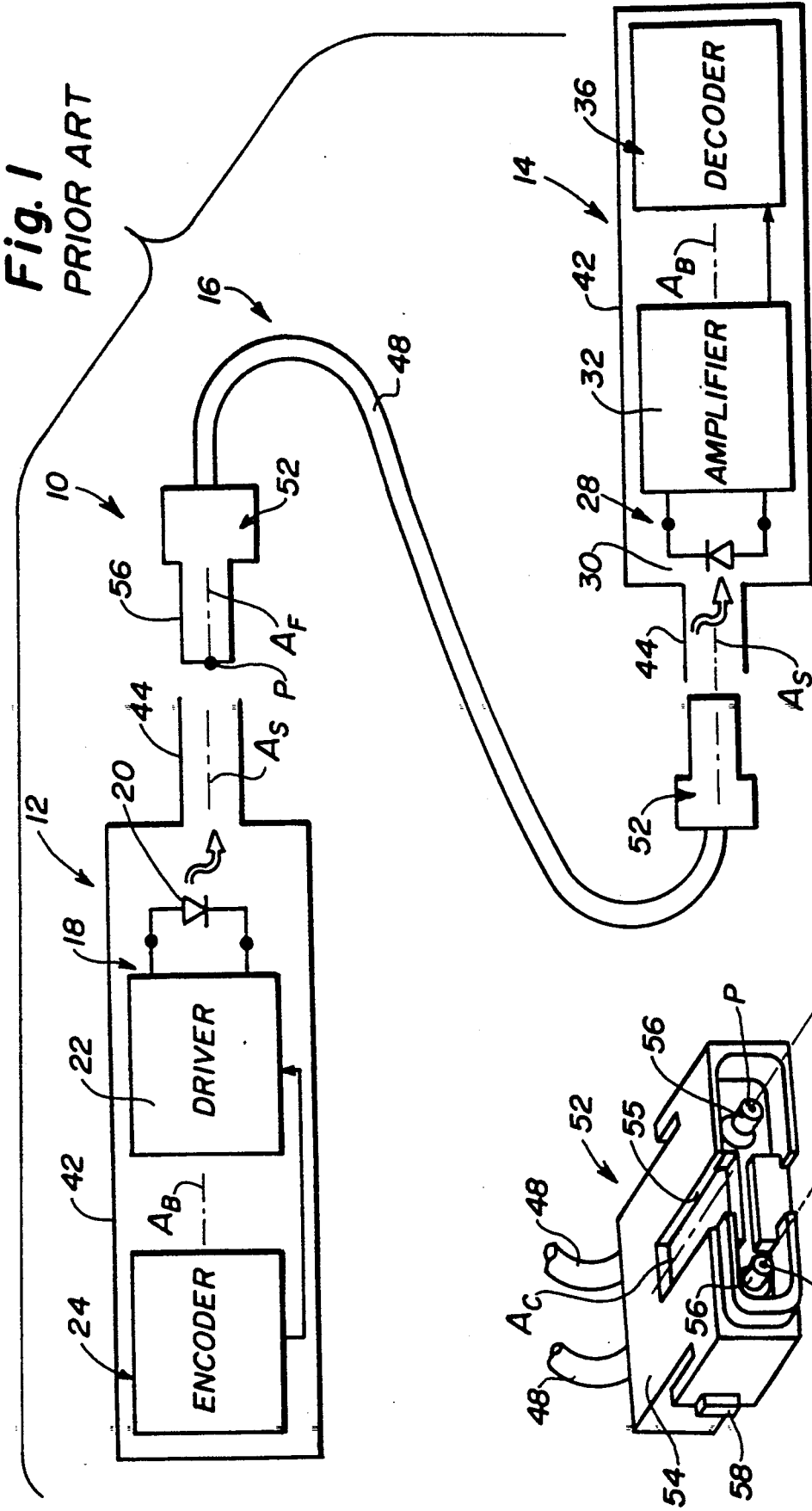

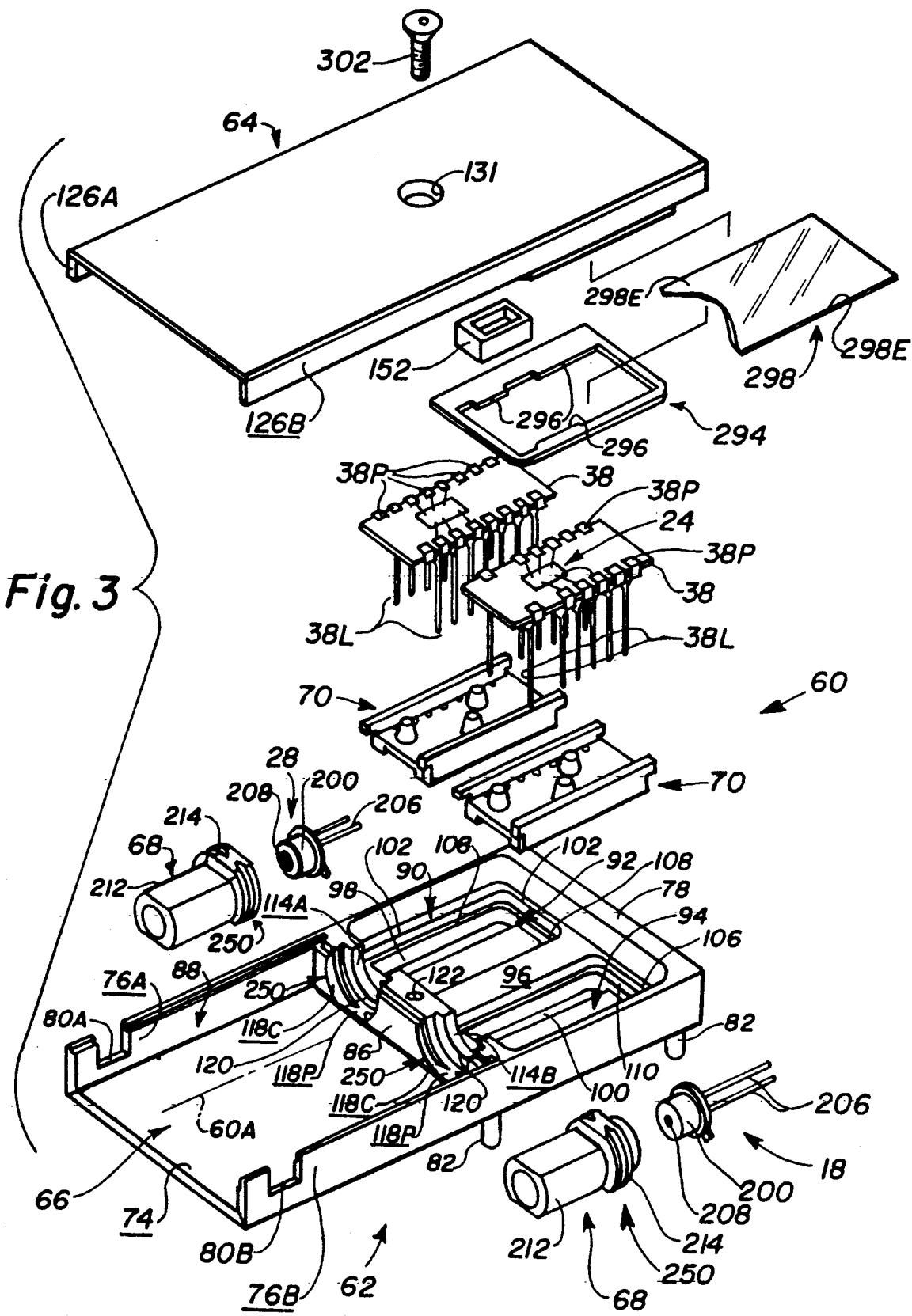

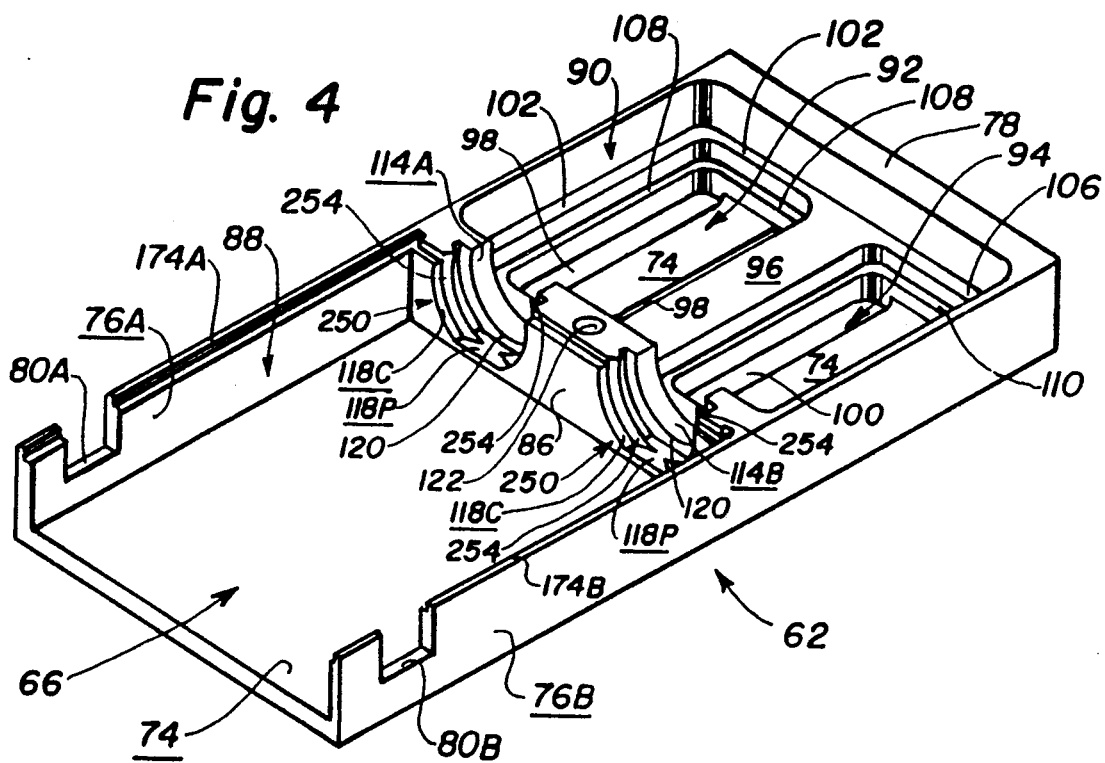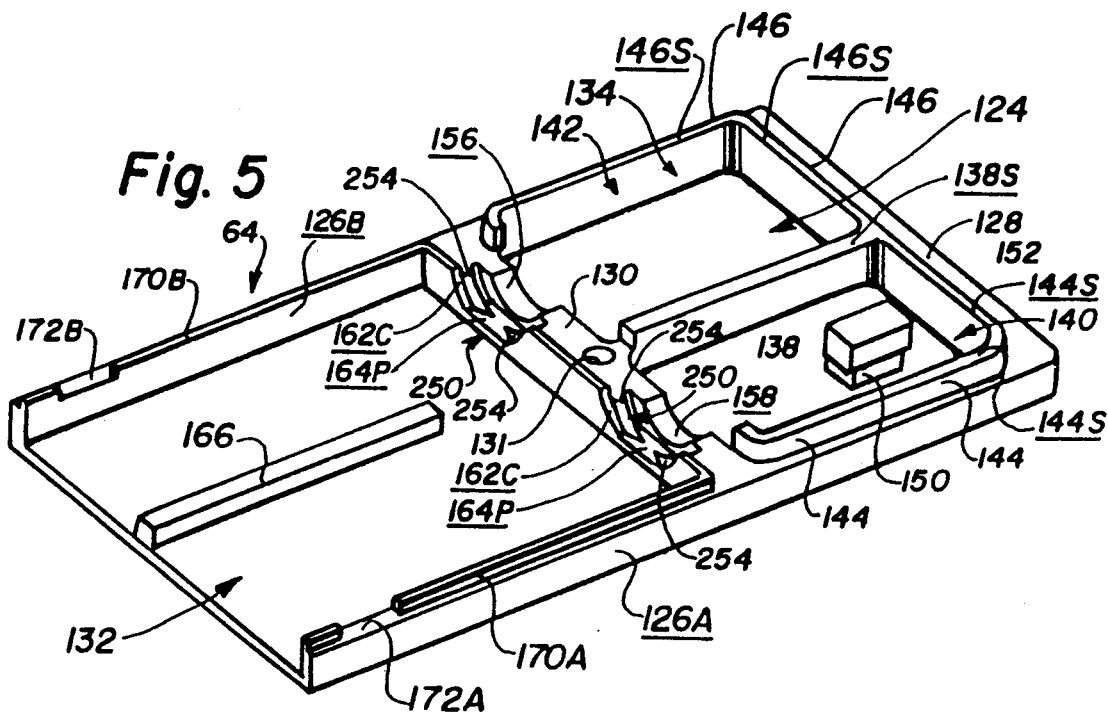

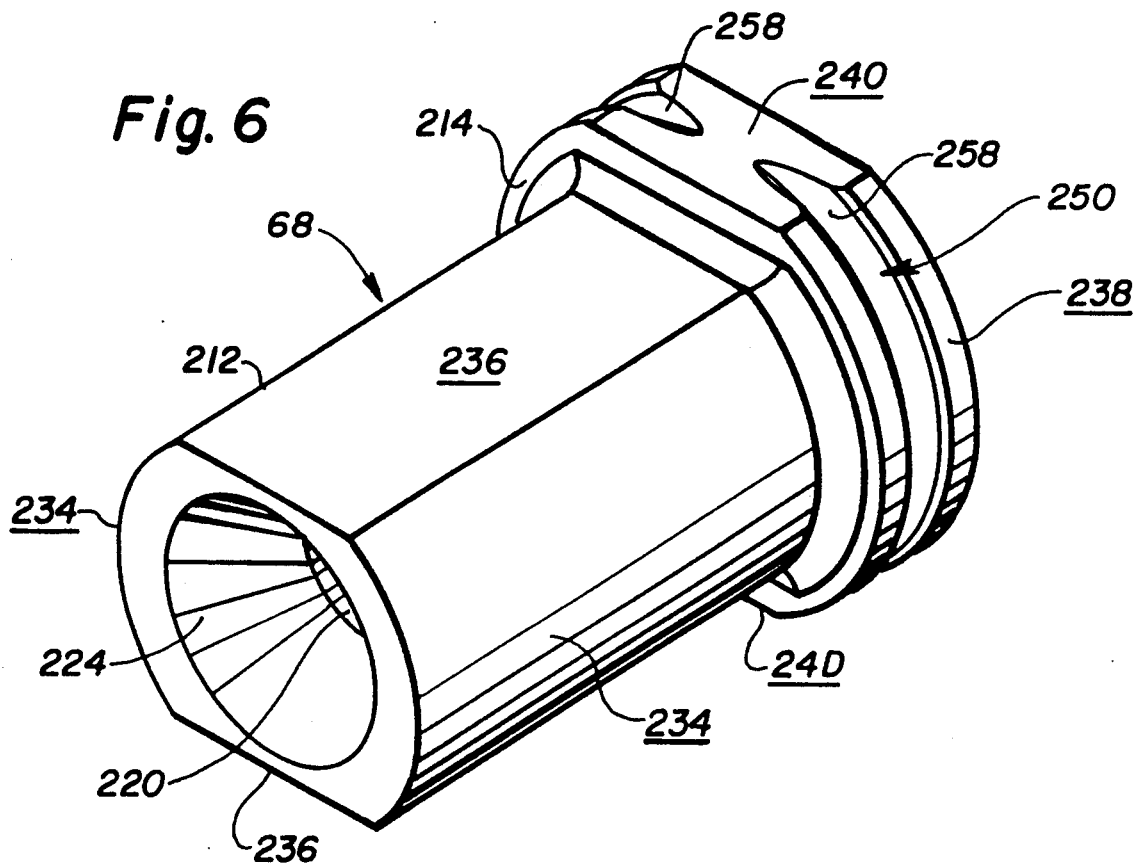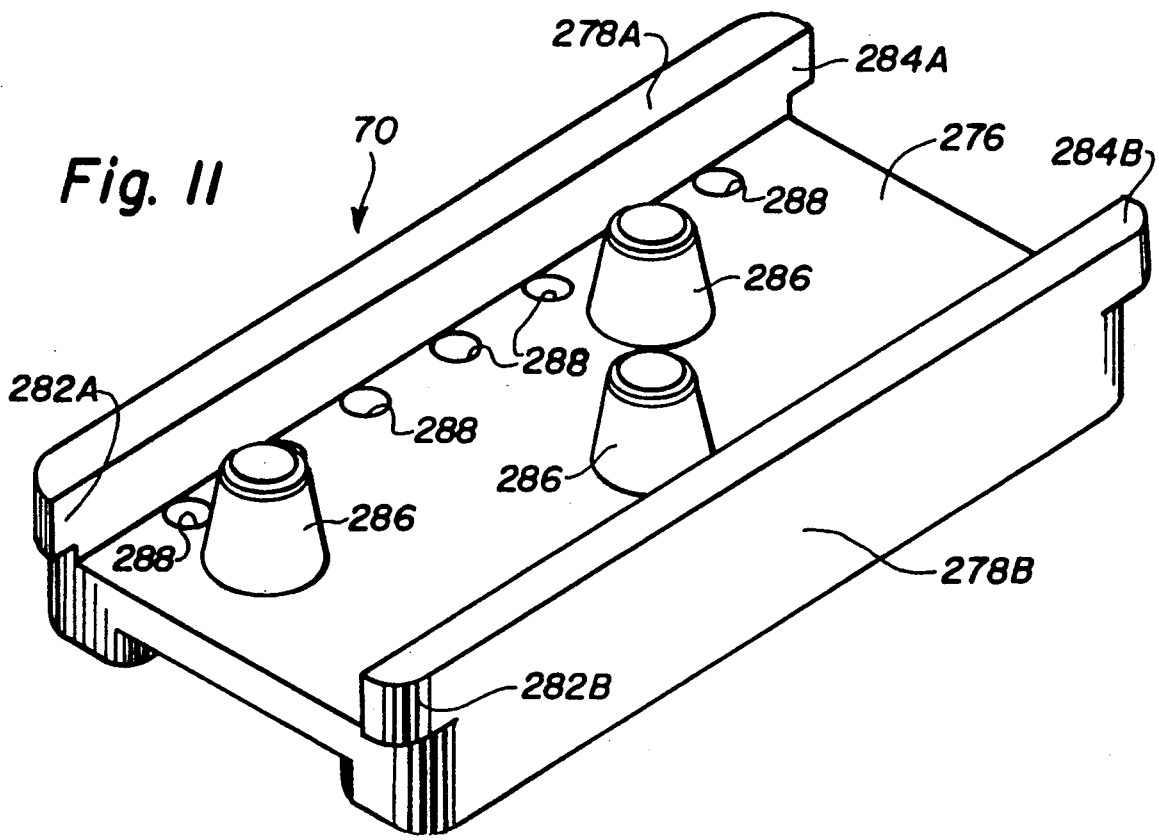

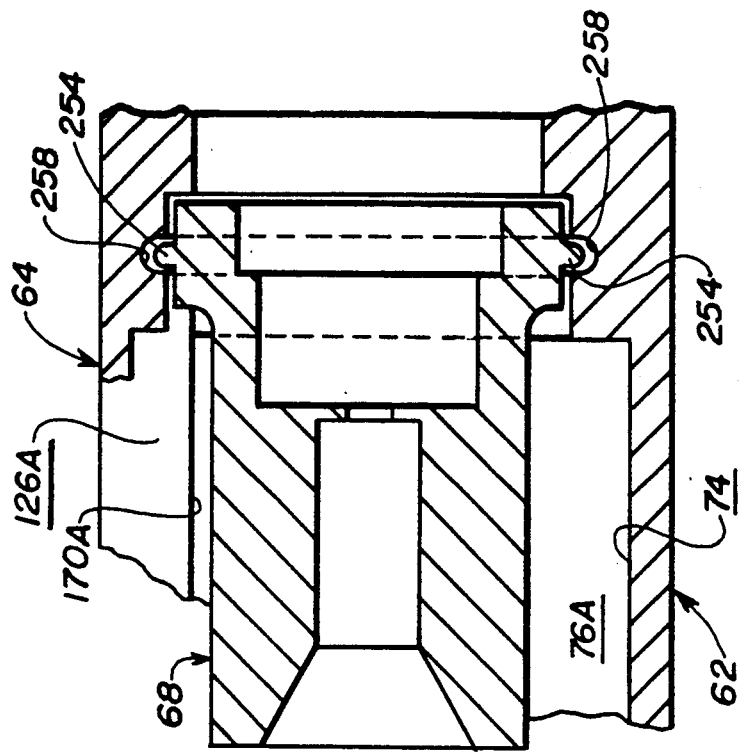
Fig. 9
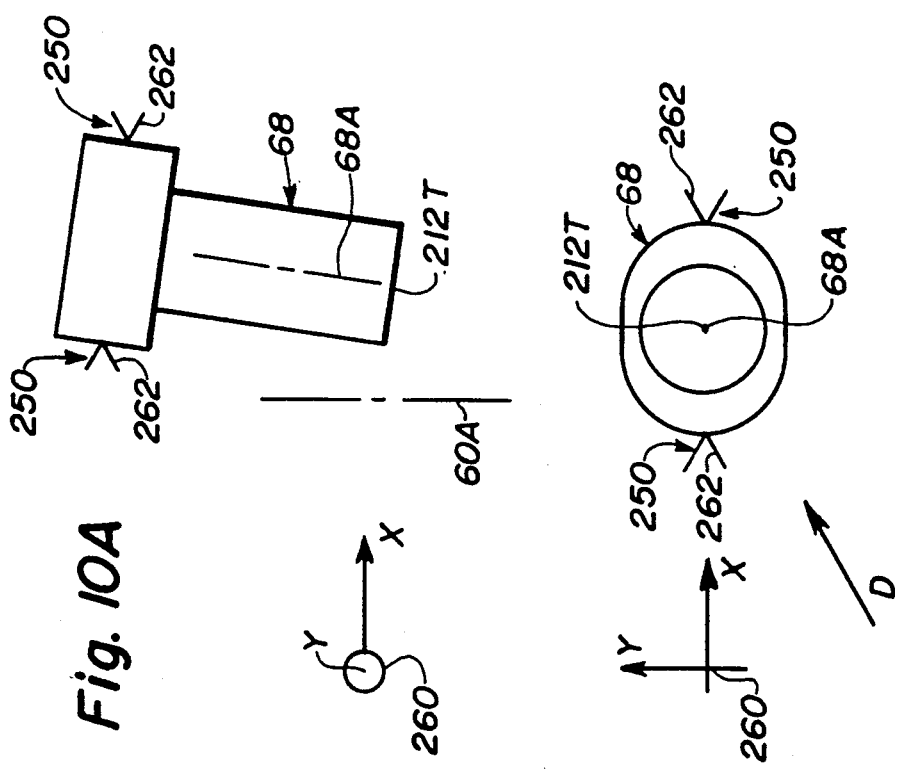
Fig. 10A
Fig. 10B

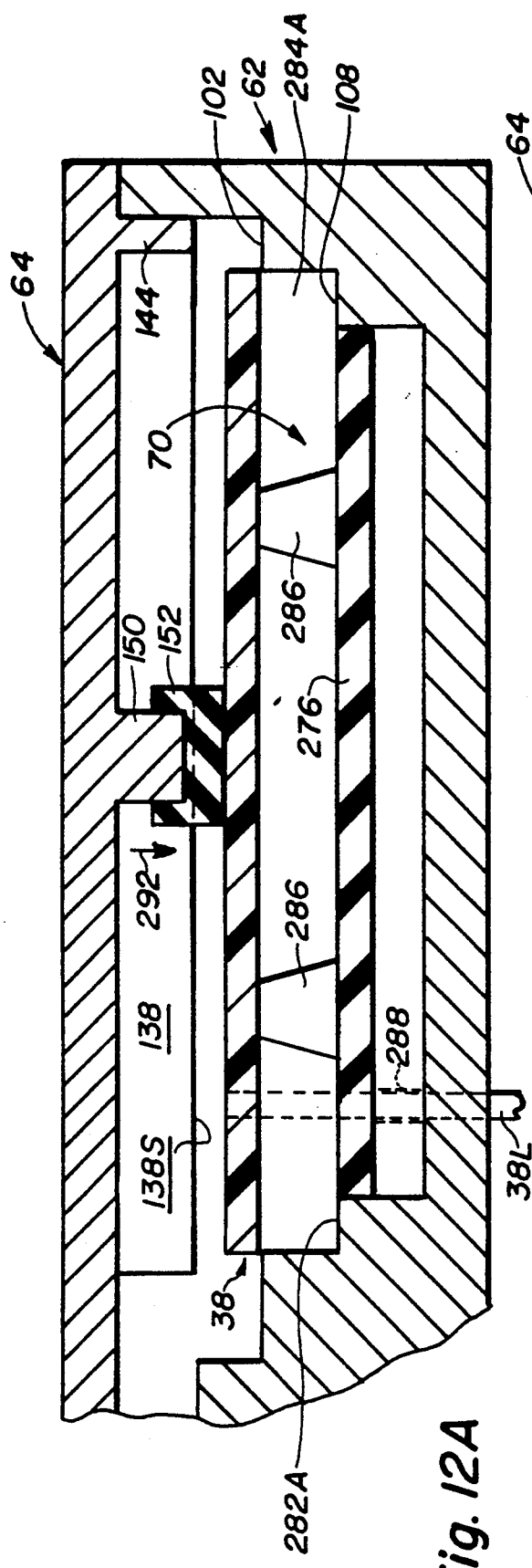
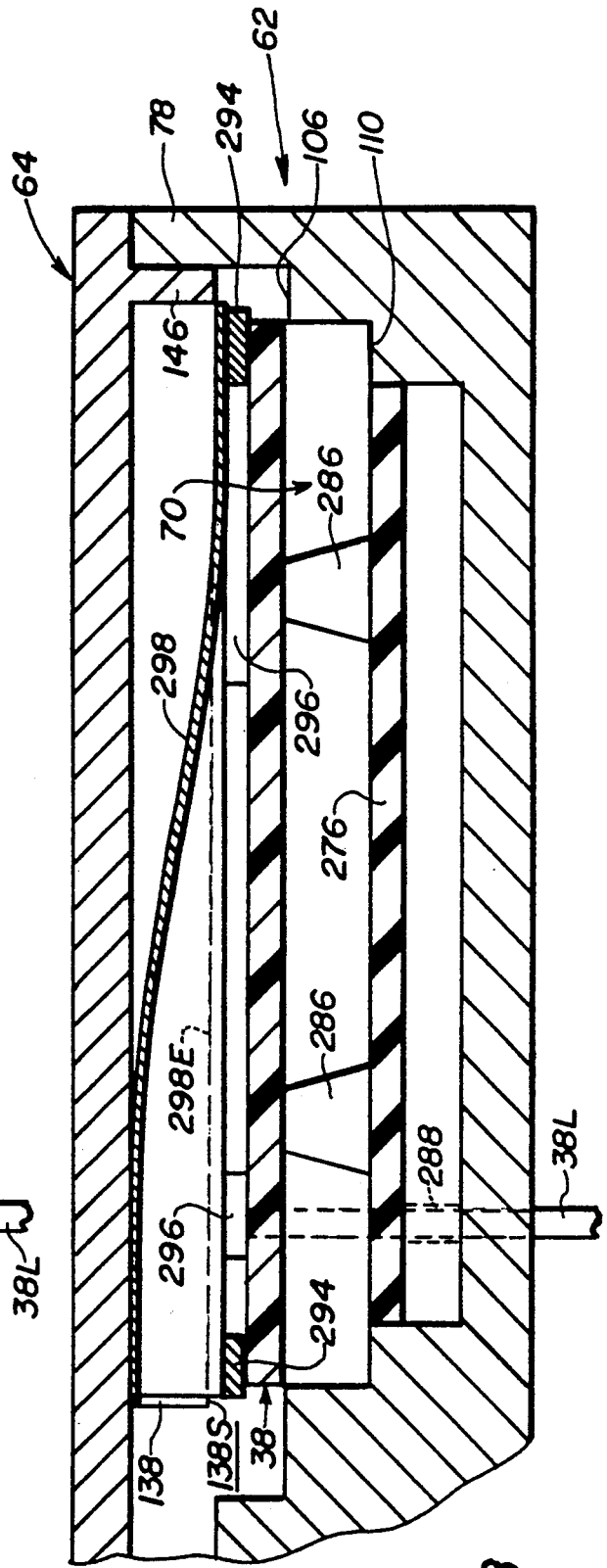
Fig. 12A
Fig. 12B

HOUSING FOR AN OPTO-ELECTRONIC DEVICE

This application is a continuation of application Ser. No. 07/354,530 filed May 19, 1989 now abandoned

BACKGROUND OF THE INVENTION

1. Field Of The Invention

The present invention relates to a housing for an optical device that includes a mounting member for receiving a ferrule, and in particular, to a housing wherein the mounting member is pivotally mounted with respect thereto.

2. Description Of The Prior Art

A fiber optic communications channel in accord with the Fiber Distributed Data Interface Standard being developed by the ANSI X3T9 committee is depicted in a highly diagrammatic representation in FIG. 1. The communications channel, generally indicated by the reference character 10, includes in its simplest form a transmitting device 12, a receiving device 14, and an optical link 16. The transmitting device 12 functionally comprises an active optical component 18 that serves as an optical source (typically a solid state laser element or an LED element 20 with an associated driver 22) and a network 24 carrying the corresponding necessary electronic coding components. Correspondingly, the receiving device 14 functionally comprises an active optical component 28 that serves as an optical detector (typically a solid state diode element 30 with an associated amplifier 32) and a network 36 carrying the corresponding necessary electronic decoding components. The solid state element 20, 30 may be housed within a suitable package and the networks 24 and 36 may be each mounted to a rigid supporting substrate 38 (FIG. 3).

The transmitting device 12 and the receiving device 14 may each be physically disposed in a housing. The housing includes a body 42 having a generally barrel shaped socket 44. The body 42 has an axis $A_B$ extending therethrough while the socket 44 has an axis $A_S$ associated therewith. The axes $A_B$ and $A_S$ are generally parallel to each other. The socket 44 is precision manufactured so that the solid state element 20, 30 in the active optical components 18 or 28, as the case may be, lies precisely on the axis $A_S$. The socket 44 is integrally or rigidly attached to the body 42 of the housing.

A hybrid device, known as a transceiver, may also be implemented. A transceiver is essentially a two-channel arrangement that disposes, in a single housing, the active components and the associated networks for both a transmitter device and a separate receiver device. The housing for such a transceiver device includes two sockets 44, one for each optical device therein.

Exemplary of a prior art transmitter device and a receiver device having the general construction as described above are the devices manufactured by BT&D Technologies, Ltd., and sold as models receiver DLR 1000 and transmitter DLT 1000, respectively.

The optical link 16 for a fiber optic communications channel 10 is defined as lying between the input to the driver 22 and the output of the amplifier 32. The link 16 includes a optical fiber cable 48. The cable 48 is physically terminated at both ends by a suitable termination 52.

Shown in FIG. 2 is a typical termination 52 for the optical fiber cables 48 used in the optical links for the two devices of a transceiver. In practice, the cables 48 may be covered by a single jacket. The termination 52 has a casing 54 which receives each of the cables 48. The casing 54 has a keyway 55 formed therein. A reference axis $A_C$ extends through the casing. The insulating jacket of each cable 48 is stripped and the fiber of each cable 48 entering in the casing 54 is inserted through a prong-like extension 56 known as a ferrule (see also, FIG. 7). The dimensions of the ferrule 56 are precisely controlled such that the end point of the fiber 48 is received by the ferrule 56 and is disposed on a point P on the end face 56F of the ferrule 56. The point P lies precisely on the axis $A_F$ of the ferrule 56. The ferrule 56 is positioned so that the axis $A_F$ lies parallel to the axis $A_C$. Latches 58 are provided on the casing 54 to facilitate the latching of the termination 52 to the housing of the optical device into which it is inserted. A typical termination is that manufactured by AMP Inc. and sold as the "Optimate" duplex connector.

In the prior art constructions the ferrule(s) 56 is(are) spring loaded within the casing 54 of the termination 52. Each fiber 48 is rigidly potted or otherwise firmly affixed within its ferrule 56. As noted earlier, the socket(s) 44 of the housing 42 that receives the termination 52 is(are) integrally or rigidly attached to the body 42 of the housing. In practice one or both of the ferrule(s) 56 may become bent so that the arrangement of their axes $A_F$ in the termination is disrupted. Alternatively or additionally, the alignment of the axis $A_S$ of the socket 44 and its associated housing may be altered. Since the socket 44 is rigidly secured to the housing, it cannot accommodate these deviations and the ferrule 56 is thus not able to be inserted accurately into the socket 44 so that the precise positioning of the fiber 48 to the optical source or optical detector, as the case may be, does not occur. In addition these deviations inhibit ease of interconnectibility of the ferrule with the housing.

In view of the foregoing it is believed advantageous to provide a casing in which a socket is compliantly mounted so that misalignments between the axis of the ferrule and the axis of the socket can be accommodated.

U.S. Pat. No. 4,149,072 (Smith), U.S. Pat. No. 4,759,599 (Yamaguchi et al.), U.S. Pat. No. 4,787,706 (Cannon et al.), U.S. Pat. No. 4,772,081 (Borgos et al.), U.S. Pat. No. 4,737,008 (Ohyama et al.), U.S. Pat. No. 4,762,388 (Tanaka et al.), U.S. Pat. No. 4,427,879 (Becher et al.), U.S. Pat. No. 4,733,934 (Wais et al.), U.S. Pat. No. 4,625,333 (Takezawa et al.), U.S. Pat. No. 4,715,675 (Kevern et al.) all disclose structures for terminations and/or housings for receiving terminations whereby a fiber is interconnected in alignment with an active device. The patent to Smith is believed pertinent in that it discloses an arrangement in which a socket is moveably mounted within its associated housing.

SUMMARY OF THE INVENTION

In a first aspect the invention relates to a housing for interconnecting an opto-electronic device with a ferrule having an optical fiber extending therethrough so that a point on the ferrule and a point on the device lie within a predetermined distance of each other along a common axis. The housing comprises a base and a cover cooperable with the base to define a chamber, the housing having an axis therethrough. A mounting member having a tip thereon and a bore therein is received within the housing and extends into the chamber. The mounting member has an axis therethrough and a retainer for supporting the opto-electronic device in a predetermined position along the axis of the bore.

The mounting member is compliantly mounted with respect to the housing by a pivot arrangement disposed on the mounting member and cooperating with at least one of the base or the cover to accommodate pivotal motion of the mounting member in response to a deflecting force imposed on the mounting member as a ferrule is introduced into the bore of the mounting member. Thus, the axis of the mounting member is permitted to translate in two orthogonal directions in a plane perpendicular to the axis of the housing and the tip of the mounting member is permitted to pivot to displace the tip of the mounting member in the two orthogonal directions in the plane perpendicular to the axis of the housing, so that the axis of the mounting member is alignable collinearly with the axis of the ferrule.

The mounting member itself has an internal septum and a second bore therein. The septum has an aperture through which the first bore communicates with the second bore. The second bore and the septum cooperate to define the retainer for the opto-electronic device such that when the package of the opto-electronic device is received within the second bore the active element in the package lies on the axis of the mounting member and communicates through the aperture with the first bore of the mounting member.

In the preferred implementation of the first aspect of the invention the pivot arrangement comprises a bead disposed on the mounting member and a corresponding groove formed in one of the the base or the cover to receive the bead therein. A groove may additionally be formed in the other of the base or the cover, the groove in this other member also receiving a portion of the bead disposed on the mounting member. It should also be understood that an alternate implementation of the pivot arrangement lies within the contemplation of the present invention. In this alternate implementation the bead is disposed on one of the base or the cover and the corresponding groove is provided on the mounting member. Additionally, the other of the base or the cover may also have a bead disposed thereon which interacts with the groove on the mounting member.

In a second aspect the present invention relates to a housing for an opto-electronic device that includes a network mounted on a rigid substrate having a plurality of legs extending therefrom. The housing comprising a base and a cover cooperable with the base to define a chamber, where one of the cover or the base has a slot therein. A board mount, formed of an elastomeric material, is disposed in a sealing relationship with one of the base or the cover when the base and the cover are conjoined. The legs of the substrate extend through the elastomeric board mount and project through the slot when the base and the cover are conjoined, with the elastomeric material of the board mount forming a seal about the legs. The board mount may further include a plurality of pylons for receiving the substrate thereon. The other of the cover or the base has an elastomeric biasing member disposed thereon, with the elastomeric biasing member acting against the substrate when the cover is conjoined to the base.

BRIEF DESCRIPTION OF THE DRAWINGS

The invention will be more fully understood from the following detailed description thereof, taken in connection with the accompanying drawings, which form a part of this application, and in which:

FIG. 1 is highly stylized schematic diagram of a fiber optic communications channel with which the present invention may be utilized;

FIG. 2 is an isolated isometric view of a dual ferrule housing used to terminate each end of two optical fibers that form the link connecting two transceiver devices;

FIG. 3 is an exploded isometric view a transceiver device having a housing incorporating the teachings of the present invention;

FIG. 4 is an enlarged isolated isometric view of the base portion of the housing shown in FIG. 3;

FIG. 5 is an enlarged isolated isometric view of the underside of the cover portion of the housing shown in FIG. 3;

FIG. 6 is an enlarged isolated isometric view of one embodiment of the the mounting member shown in FIG. 3

FIG. 9 is a side elevational view, in section, showing a housing in accordance with an alternate embodiment of the present invention;

FIG. 10A and 10B are diagrammatic views of the degrees of freedom within which the axis of a mounting member within a housing in accordance with the present invention may move, with the view of FIG. 10A being in a plane containing the axis of the housing and the view of FIG. 10B being in a plane perpendicular thereto FIG. 11 is an enlarged isolated isometric view of the elastomeric board mount shown in FIG. 3; and FIG. 12A and 12B are elevational views taken generally along section lines 12A—12A and 12B—12B in FIG. 8 illustrating the mounting within the housing of the substrate for transmitter and for a receiver, both view also illustrating another aspect of the present invention.

DETAILED DESCRIPTION OF THE INVENTION

Figure 7:
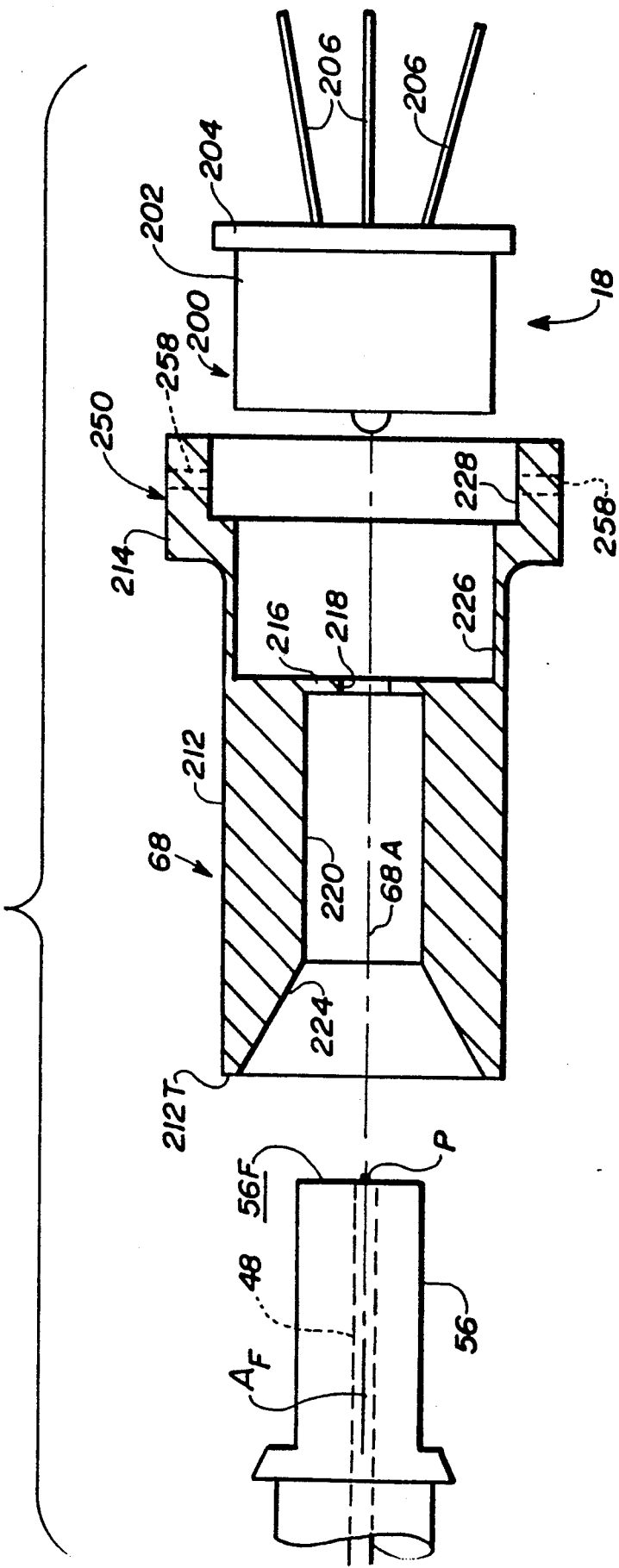
FIG. 7 is an exploded elevational view of the mounting of an active component within a mounting member shown in FIGS. 3 and 6.

Throughout this application, similar reference numerals refer to similar elements in all Figures of the drawings.

Figure 8:
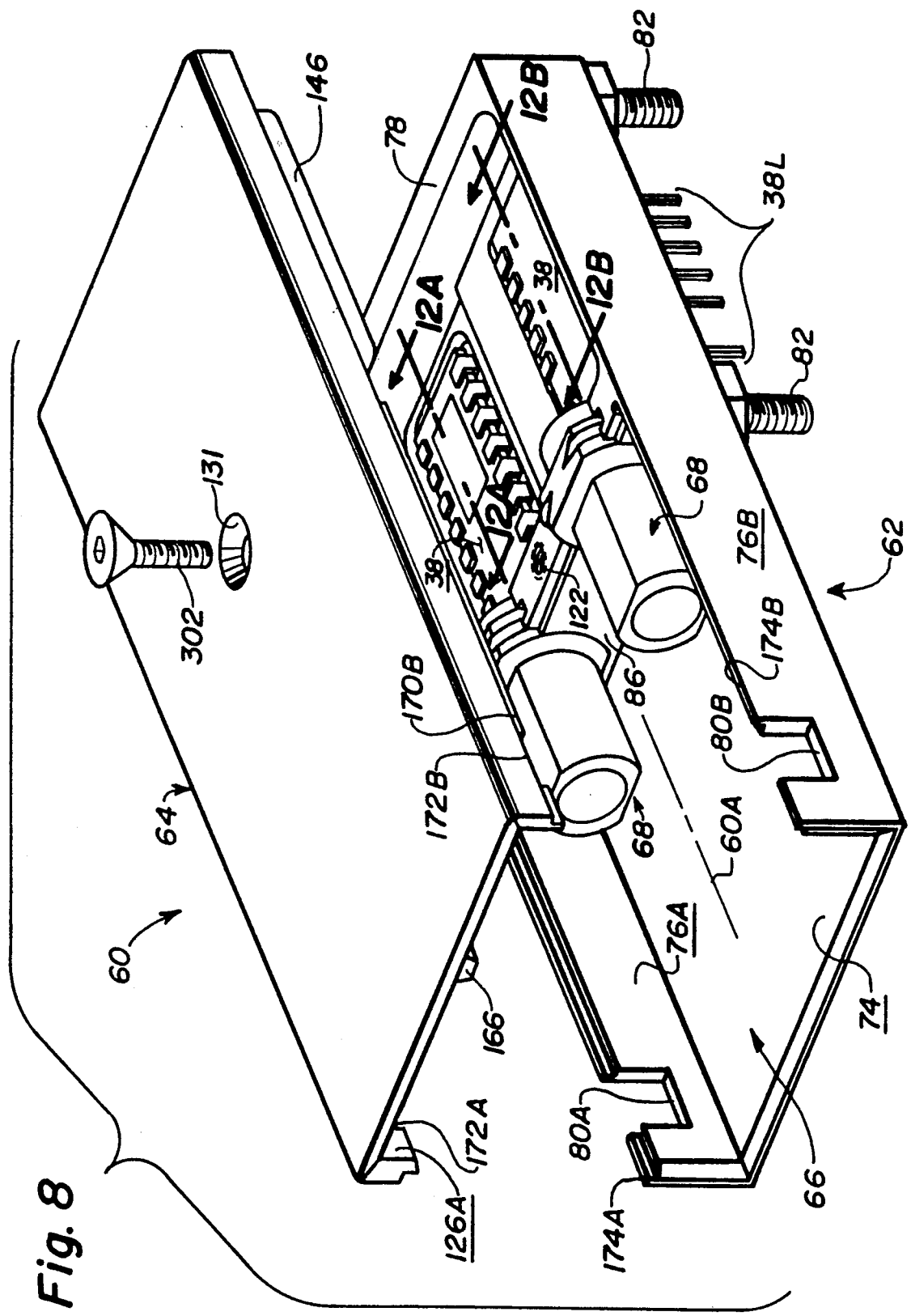
FIG. 8 is a partially exploded isometric view showing the elements of FIG. 3 in a partially assembled condition.

Shown in FIG. 3 is an exploded isometric view of a housing generally indicated by reference character 60 embodying the teachings of the present invention. The housing 60 includes a lower housing member, or base, 62 (also seen in FIG. 4) and a corresponding cover 64 (also seen in FIG. 5). The base 62 and the cover 64 cooperate to define a generally enclosed chamber 66 within which active device mounting members, or mounts, 68 (also seen in FIG. 6) and elastomeric board inserts 70 (also seen in FIG. 11) are received. The housing 60 has an axis 60A (FIGS. 3 and 8) extending therethrough.

A floor 74 defines the basic thickness of the base 62. Parallel sidewalls 76A, 76B, respectively, and an upstanding transverse endwall 78 extend from the floor 74. Each sidewall 76A, 76B has a window 80A, 80B respectively therein. If desired, legs 82 may be provided on the undersurface of the base 62. The legs 82 are not seen in FIG. 4. The base 62 has formed therein a transversely extending partition 86 which subdivides the chamber 66 into forward and rear regions 88, 90, respectively. The rear region 90 is itself subdivided into two recesses 92 and 94, respectively, (best seen in FIGS. 3 and 4) by an axially extending bulkhead 96.

Portions of the floor 74 in each of the recesses 92, 94 are removed to define a pair of slots 98 (in the recess 92) and a pair of slots 100 (in the recess 94) whereby each recess communicates with the exterior of the base 62. A shelf 102 is formed in the sidewall 76A and the end wall 78 (on one side of the bulkhead 96) adjacent to and partially surrounding the first recess 92. Similarly, the sidewall 76B and the end wall 78 (on the other side of the bulkhead 96) have a second shelf 106 surrounding the second recess 94. The surfaces of the shelves 102, 106 are coplanar with the surface of the bulkhead 96. Within each of the recesses 92, 94, vertically between the corresponding respective shelf 102, 106, there is defined a respective peripheral ledge 108, 110.

The rearward portion of the partition 86 (that is, the side of the partition 86 confronting the recesses 92, 94) is relieved to define a generally circular cradle surfaces 114A, 114B. The cradle surface 114A communicates with the recess 92, while the cradle surface 114B communicates with the recess 94. The forward portion of the partition 86 (that is, the side of the partition confronting the forward region 88 of the chamber 66) is cut away to define generally circular surfaces 118C that lie contiguous to a planar surface 118P. As is seen in FIGS. 3 and 4, the circular surfaces 118C have a greater diametrical dimension than do the corresponding cradles 114A or 114B to which they are proximal. Accordingly there is defined a lip 120 between the cradle surface 114A, 114B, as the case may be, and the adjacent planar surface 118P. As will be more fully developed, the planar surface 118P serves as an anti-rotation keying surface useful for a purpose to be described. A bore 122 is formed in the partition 86 at any convenient location thereon, typically generally intermediate the cradles 114A, 114B.

The cover 64 is best illustrated in FIG. 5, which is an isometric view of the same from the undersurface thereof. The cover 64 is a generally planar member from the undersurface of which extends generally parallel sidewalls 126A, 126B and a transversely extending end wall 128. A transverse partition 130, having a bore 131 therein, subdivides the cover into forward and rear regions 132, 134, respectively. The rear portion 134 of the cover 64 has a central wall 138 that extends generally axially of the cover from the partition 130 to the end wall 128. The wall 138 subdivides the rear portion 124 of the cover 64 into first and second regions 140, 142. The wall 138 has a surface 138S thereon useful for a purpose to be described. Each of the regions 140, 142 is surrounded on two sides by a peripheral flange 144, 146, respectively. Each flange 144, 146 has a surface 144S, 146S, respectively thereon. The surfaces 144S, 146S are coplanar with the surface 138S of the wall 138. An abutment 150 is provided on the cover 64 in the region 142. The abutment 150 has an elastomeric tip 152 secured thereto. As will be developed and explained in connection with FIG. 12A, the tip 152 serves to bias a substrate 38 received in the recess 92 against the shelf 102. Accordingly, the footprint 152F (FIG. 8) of the tip 152 is indicated in dashed lines on the surface of the substrate 38 received in the recess 94.

Similar to the situation in the base 62, the rearward portion of the partition 130 (the portion nearer to the regions 140, 142) is provided with generally circular scallops 156, 158. The forward portion of the partition 130 is cut away to define generally circular surfaces 162C that lie contiguous to a planar surface 164P. As is seen in FIG. 5, the circular surfaces 162C have a greater diametrical dimension than do the corresponding scallops to which they are proximal. Analagous to the situation on the base 62, the planar surfaces 164P serves as an anti-rotation keying surface useful for a purpose to be described. A generally axially extending key 166 is provided on the cover 64. The key 166 is receivable by the keyway 55 in the casing 54 (FIG. 2). The presence of the key and corresponding keyway restricts the use of the housing 60 to a compatible termination 52.

A peripheral lip 170A extends on the forward portion of the sidewall 126A while a corresponding peripheral lip 170B extends on the forward portion of the sidewall 126B. The lips 170A, 170B are interrupted by slots 172A, 172B. The lips 170A, 170B contact with lips 174A, 174B that lie atop the sidewalls 76A, 76B on the base 62 when the cover 64 is conjoined to the base 62. The forward edges of the cover 64 and the sidewalls 126A, 126B thereof, and the forward edge of the base 62 and of the sidewalls 76A, 76B thereof, are beveled to define a lead-in to the chamber 66. When the cover 64 is conjoined to the base 62 the windows 80A, 80B register with the corresponding slots 172A, 172B to define openings to receive latches 58 (FIG. 2) on the housing 54 of the termination 52.

The base 62 and the cover 64 are manufactured from a suitable material, such as 6061 aluminum by any suitable method, such as machining. Alternatively these parts may be fabricated by die casting a zinc material, such as that known as "ZMAK-3". The elastomeric tip 152 may be fabricated from a silicone such as that sold by General Electric Corporation as RTV 664.

The active optional components 18 and 28 (for the transmitter device 12 and for the receiver device 14, respectively) are housed in the familiar "TO" or "top hat" housing 200, seen in FIGS. 3 and 7. Such a housing 200 includes a generally cylindrical cannister 202 That has a peripheral flange 204 thereon. From the undersurface of the cannister 202 extends metallic legs 206 by which are made the necessary electrical connections to the solid state elements therewithin contained and the networks on the substrates 38. The solid state element is optically accessible through a port 208 in the top surface of the cylindrical cannister 202. Of course, the size of the aperture 208 depends upon the nature of the solid state element in the cannister 202. It is noted that in FIG. 7 the component 28 for the receiver device 14 is shown.

In accordance with this invention, each of the housings 200 is received within a device mounting member, or mount, 68. The structure of a mount 68 may be more fully appreciated from FIGS. 6 and 7.

The mount 68 is a generally elongate hollow member having an axis 68A extending therethrough. The principal function of the mounting member is to align the fiber to the active device so that the launch or receive power is optimized. The mount provide for the positioning of the active device so that its focal point is at the optical plane of the fiber. The mount has a forward barrel portion 212 and a rearward collar portion 214. The tip 212T of the barrel 212 defines the forward end of the mounting member 68. On the interior of the mount 68 (FIG. 7) there is an internal septum 216 having an aperture 218 therein. The size of the aperture 218 corresponds to the nature of the solid state element housed in the cannister 202 to be received in the mount.

The barrel portion 212 has a generally cylindrical, precision machined bore 220 that defines a ferrulereceiving receptacle, the bore 220 corresponding functionally to the socket 44 used in prior art. A tapered lead-in 224 is provided.

As seen in FIG. 6 the collar portion 214 of the mount 68 has a first counterbore 226 and a second counterbore 228. The bores 226, 228, as well as the aperture 218 and the cavity 220, all align on the axis 68A of the mount 68. The axis 68A corresponds to the axis of the socket $A_S$, as discussed in the connection with FIG. 1.

The counterbore 226 is sized to closely receive the cannister 202 of the housing 200. As may be appreciated from FIG. 7, when the housing 200 is received within the mount 68 the end of the cannister 202 abuts the septum 216, and the flange 204 is received on the shoulder defining the counterbore 228. In this position the optical port 208 in the cannister 202 aligns with the aperture 218 in the internal septum 216. It may thus be appreciated from the foregoing that the portion of the mount 68 having the counterbore 226 defines a retainer for accepting the housing for the active component and for supporting the same in a predetermined position along the axis 68A. The mounting member is made of stainless steel, preferably 303 free machining stainless steel. The mounting member uniformly transmits insertion forces to the housing 60.

The exterior of the barrel portion 212 is generally oval in shape having rounded sides 234 and planar upper and lower major surfaces 236. The exterior of the collar portion 214 is also generally oval in shape, albeit somewhat enlarged with respect to the barrel portion 212, having rounded sides 238 and planar upper and lower major surfaces 240. When the cover 64 and the base 62 are conjoined the surfaces 236 are spaced respectively therefrom to permit the receipt of the leading edge of the casing 54 of the termination 52 (i.e., the portion surrounding the ferrules 56, FIG. 2) in the chamber 66 of the housing 60.

As discussed earlier, it is important to position the point P (e.g., as seen in FIG. 7) on the end face 56F of the ferrule 56 at which the fiber F terminates precisely on the axis 68A extending through the cavity 220 of the barrel portion 212. However, for the reasons discussed earlier, if the axis $A_F$ extending through the ferrule 56 is misaligned with respect to the axis 68A of the mount 68, the necessary optical alignment of the optical elements (i.e., the fiber 48 in the ferrule 56 and the solid state element in the cannister 202) will not be achieved. Also the interconnectibility and removability of the parts, or at least the ease of attaining the same, may be compromised.

Therefore, in accordance with a first aspect of the present invention there is provided a pivot arrangement generally indicated by the reference character 250 disposed on the mount 68 that cooperates with at least one of the base 62 or the cover 64 (or, in the most preferred instance, with both the base 62 and the cover 64) for accommodating motion of the mount 68 in response to a deflecting force imposed thereon as a ferrule 56 is introduced into the cavity 220 of the mount 68. As a result, as will be explained, the axis 68A of the mount 68 is permitted to translate in two orthogonal directions in a plane perpendicular to the axis 60A of the housing 60. In addition the mounting member is permitted to pivot to permit the tip 212T of the barrel 212 (and hence the mounting member 68) to displace in the two orthogonal directions in the plane perpendicular to the axis 60A of the housing 60, to align the axis 68A of the mount 68 collinearly with the axis $A_F$ of the ferrule 56.

In a first embodiment of this aspect of the invention, as shown in FIGS. 4, 5 and 6, the pivot arrangement 250 comprises a bead 254 and a corresponding groove 258. The bead 254 is disposed on the circular surfaces 118C and/or on the planar surfaces 118P on the base 62. Beads 254 may be additionally or alternatively provided on the circular surfaces 162C and/or on the planar surfaces 164P on the cover 64. In the preferred case the beads 254 extend over the circular surfaces 118C and 162C on the base 62 and on the cover 64, respectively, with some portion of the beads 254 lying on the corresponding planar surfaces 118P and 164P. Of course, it lies within the contemplation of the invention to dispose the beads 254 solely on the circular surface or solely on the planar surfaces, as should be apparent to those skilled in the art.

To receive the beads so provided, the pivot arrangement 250 further comprises grooves 258 (FIG. 6) formed on the corresponding rounded side surfaces 238 and/or planar surfaces 240 of the collar portion 214 of the mount 68. The grooves 258 are disposed on the mounts 68 in those locations and to that extent necessary to interact to provide the compliance or motion of the mount 68 to be described.

It should be noted, of course, the the disposition of the beads 254 and of the grooves 258 may be interchanged from that described above. This interchanged relationship is shown in FIG. 9 wherein the beads 254 are disposed on the mounts 68 while the grooves 258 are correspondingly disposed on the surfaces of the base 62 and the cover 64, as needed. In either case, the beads 254 and the grooves 258 prevent the mounting members 68 from being excessively axially movable (i.e., in the direction of the axis 60A) the housing 60 when the ferrule 56 is inserted or removed from the housing 60.

The moveability, or compliance, accorded to the mount 68 with respect to the housing 60 permits the mount 68 to accommodate deviations in alignment of the axis $A_F$ of the ferrule 56. As seen from FIGS. 10A and 10B, which are respective diagrammatic views in a plane containing the axis 60A of the housing 60 and in a plane perpendicular thereto, the mount 68 and its axis 68A may move in response to any deflecting force D imposed thereon by the ferrule 56 as the ferrule is introduced into the bore 220 of the mount 68 in the X and Y directions, as indicated by the coordinate axes 260. The axis 68A of the mounting member 68 (and the mounting member 68 itself) may translate in the X and y directions. Further, with the pivot arrangement 250 diagrammatically indicated as the fulcrum 262, the forward tip 212T of the mounting member 68 may pivot a predetermined angular amount so that the tip 212T is also displaceable in the X and Y directions in the plane perpendicular to the axis 60A of the housing 60 (that is, the plane of FIG. 10B). Thus the mount 68 may align with the axis $A_F$ of the ferrule 56. The absolute magnitudes of these motions are modest. The translations of the mounting member is in the preferred cases on the order of plus or minus 0.003 inches (in the directions X or Y). The included angle of the pivotal movement of the tip 212T of the mounting member 68 is preferably on the order of and 1.80 degrees. These ranges of motion are sufficient to permit the mount 68 to align to accept the ferrule 56.

The rotation of the mounting member 68 about its axis 68A is limited by the interaction of the planar surfaces 240 on the mounting member 68 with the surfaces 118P and 164P on the base 62 and the cover 64, respectively.

The electronic networks 24, 36 are, as noted earlier, mounted to a rigid substrate (e.g., circuit board) 38. The networks are covered with a suitable epoxy encapsulant. Legs 38L extend from connection pads 38P on the surface of the board 38 and must exit the housing 60 through the pairs of slots 98 or 100 formed in the floor 74 in the recesses 92, 94. However, to permit this to occur, some expedient must be used to seal the interior of the housing 60. Accordingly, in its other aspect, the present invention relates to an arrangement for sealing the interior of the housing 60 and the legs 38L where the same pass therefrom. In addition the mount 70 electrically insulates the legs 38L from the housing 60.

To this end a board mount generally indicated by the character 70 (best seen in FIG. 11) is disposed in each of the recesses 92, 94. Each of the mounts 70 is a generally planar pad fabricated from a self healing elastomeric material, such as the material used for the tip 152, although other suitable materials such as a fluoroelastomer material manufactured by E. I. DuPont de Nemours and Company and sold under the trademark "VITON" may be used. The mount 70 is perimetrically configured to conform to the shape of the recess into which it is inserted. The mount 70 has a central web 276 with two generally parallel side rails 278A, 278B. The rails 278A, 278B extend both above and below the web 276. At the end of each rail 278A, 278B are provided forward and rearward tabs 282A, 282B and 284A, 284B. The planar web 276 has an array of pylons 286 on the upper surface thereof. An array of openings 288 is defined in the web 276 along each rail 278A, 278B.

In use, as may be understood from FIGS. 12A and 12B, which are assembled views of a housing 60 in accordance with the invention, an insert 276 is laid into each recess 92, 94, as the case may be. It is noted that not all of the legs 38L are indicated in FIGS. 12A and 12B, for clarity of illustration. The underside of each of the tabs 282A, 282B (and the tabs 284A, 284B) of the inserts 70 sit on the ledges 108 (FIG. 12A) or on the ledges 110 (FIG. 12B) formed in the base 62 in the recesses 92, 94, respectively. The substrate 38 is, in each case, accepted on the pylons 286 and supported thereon. As the legs 38L pass through the openings 288 in the insert 70 the self-healing elastomeric material of the web 274 seals the legs 38L.

As seen in FIG. 12A in the case of a substrate 38 for a transmitter received in the recess 92, the substrate 38 is biased against the mount 70 and the same biased against the ledge 108, in the direction of the arrow 292, by the action of the elastomeric tip 152 on the abutment 150.

As may be understood from FIG. 12B, taken in connection with FIG. 3, in the case of a substrate 38 for a receiver that is received in the recess 94, a frame-like board retainer 294 having fingers 296 is overlaid on the substrate 38. Above the retainer 294 is provided a metallized shield 298. The shield 298 is secured, as by a tin-/lead solder, against the metallized upper surface of the retainer 294. The edges 298E of the shield are clamped by the surfaces 138S and the portion of the surface 146S of the flange 146 that lies along the sidewall of the cover 64.

The base 62 and the cover 64 are held together by a mounting screw 302 that passes through the bore 131 in the cover 64 and engages in the bore 122 in the partition 86 in the base 62.

If desired the entire volume of the rear region 90 of the chamber 66 may be filled with a curable silicone or epoxy encapsulant, such as that sold by General Electric Company under the trademark "SYLGARD" Q3-6605, that sold by Master Bond, Inc., Hackensack, N.J. as EP21AOHTLV, or that sold by Hysol Inc., Industry, California, as "HYSOL 1061".

It should be apparent from the foregoing that although the invention has been described in the context of a housing for a transceiver device, the teachings thereof may be applied with equal efficacy to housings used for single or multi-channel optical devices. It should also be apparent that those skilled in the art may, having benefit of the teachings of the present invention as set forth herein, may impart numerous modifications thereto. Such modifications are to be construed as lying within the contemplation of the present invention, as defined by the appended claims.

What is claimed is:

1. A housing for interconnecting an opto-electronic device with a ferrule having an optical fiber extending therethrough so that a point on the ferrule and a point on the device lie within a predetermined distance of each other along a common axis, the housing having an axis therethrough, the housing comprising:
    a base, a cover cooperable with the base to define a chamber,
    a mounting member having a tip thereon and a bore therein, the bore having an axis therethrough, the mounting member extending into the chamber, the mounting member having a retainer for supporting an opto-electronic device in a predetermined position along the axis of the bore,
    a pivot arrangement disposed on the mounting member and cooperating with at least one of the base or the cover for accommodating motion of the mounting member in response to a deflecting force imposed on the mounting member as a ferrule is introduced into the bore of the mounting member,
    thereby to permit the axis of the mounting member to translate in two orthogonal directions in a plane perpendicular to the axis of the housing and to permit the mounting member to pivot to displace the tip of the mounting member in the two orthogonal directions in the plane perpendicular to the axis of the housing, so that the axis of the mounting member is alignable collinearly with the axis of the ferrule.

2. The housing of claim 1 wherein the opto-electronic device includes an active element disposed within a package, the mounting member having an internal septum and a second bore therein, the septum having an aperture through which the first bore communicates with the second bore, the second bore and the septum cooperating to define the retainer for the opto-electronic device, such that when the package of the opto-electronic device is received within the second bore the active element in the package lies on the axis of the mounting member and communicates through the aperture with the first bore of the mounting member.

3. The housing of claim 2 wherein the pivot arrangement comprises a bead disposed on the mounting member and a corresponding groove formed in the base to receive the bead therein.

4. The housing of claim 3 wherein the pivot arrangement further comprises a corresponding groove formed in the cover, the groove in the cover also receiving a portion of the bead therein.

5. The housing of claim 3 wherein one of the cover or the base has a slot therein, further comprising:
a board mount formed of an elastomeric material, the board mount being disposed in a sealing relationship with the one of the base or the cover when the base and the cover are conjoined, and
a substrate having a plurality of legs extending therefrom, the legs extending through the elastomeric board mount and projecting through the slot when the base and the cover are conjoined, the elastomeric material of the board mount forming a seal about the legs.

6. The housing of claim 5 wherein the board mount further comprises a plurality of pylons for receiving the substrate thereon.

7. The housing of claim 6 wherein the other of the cover or the base has an elastomeric biasing member disposed thereon, the elastomeric biasing member acting against the substrate when the cover is conjoined to the base.

8. The housing of claim 5 wherein the other of the cover or the base has an elastomeric biasing member disposed thereon, the elastomeric biasing member acting against the substrate when the cover is conjoined to the base.

9. The housing of claim 2 wherein the pivot arrangement comprises a bead disposed on the mounting member and a corresponding groove formed in the cover to receive the bead therein.

10. The housing of claim 2 wherein the pivot arrangement comprises a bead formed in the cover and a corresponding groove disposed on the mounting member to receive the bead therein.

11. The housing of claim 2 wherein one of the cover or the base has a slot therein, further comprising:
a board mount formed of an elastomeric material, the board mount being disposed in a sealing relationship the one of the base or the cover when the base and the cover are conjoined, and
a substrate having a plurality of legs extending therefrom, the legs extending through the elastomeric board mount and projecting through the slot when the base and the cover are conjoined, the elastomeric material of the board mount forming a seal about the legs.

12. The housing of claim 11 wherein the board mount further comprises a plurality of pylons for receiving the substrate thereon.

13. The housing of claim 12 wherein the other of the cover or the base has an elastomeric biasing member disposed thereon, the elastomeric biasing member acting against the substrate when the cover is conjoined to the base.

14. The housing of claim 11 wherein the other of the cover or the base has an elastomeric biasing member disposed thereon, the elastomeric biasing member acting against the substrate when the cover is conjoined to the base.

15. The housing of claim 2 wherein the pivot arrangement comprises a bead formed in the base and a corresponding groove disposed on the mounting member to receive the bead therein.

16. The housing of claim 15 wherein the pivot arrangement further comprises a bead formed on the cover, the groove in the mounting member also receiving the bead on the cover therein.

17. The housing of claim 15 wherein one of the cover or the base has a slot therein, further comprising:
a elastomeric board mount formed of an elastomeric, the board mount being disposed in a sealing relationship with the one of the base or the cover when the base and the cover are conjoined, and
a substrate having a plurality of legs extending therefrom, the legs extending through the elastomeric board mount and projecting through the slot when the base and the cover are conjoined, the elastomeric material of the board mount forming a seal about the legs.

18. The housing of claim 17 wherein the board mount further comprises a plurality of pylons for receiving the substrate thereon.

19. The housing of claim 18 wherein the other of the cover or the base has an elastomeric biasing member disposed thereon, the elastomeric biasing member acting against the substrate when the cover is conjoined to the base.

20. The housing of claim 17 wherein the other of the cover or the base has an elastomeric biasing member disposed thereon, the elastomeric biasing member acting against the substrate when the cover is conjoined to the base.

21. The housing of claim 1 wherein the pivot arrangement comprises a bead disposed on the mounting member and a corresponding groove formed in the base to receive the bead therein.

22. The housing of claim 21 wherein one of the cover or the base has a slot therein, further comprising:
a elastomeric board mount formed of an elastomeric, the board mount being disposed in a sealing relationship with the one of the base or the cover when the base and the cover are conjoined, and
a substrate having a plurality of legs extending therefrom, the legs extending through the elastomeric board mount and projecting through the slot when the base and the cover are conjoined, the elastomeric material of the board mount forming a seal about the legs.

23. The housing of claim 22 wherein the other of the cover or the base has an elastomeric biasing member disposed thereon, the elastomeric biasing member acting against the substrate when the cover is conjoined to the base.

24. The housing of claim 22 wherein the board mount further comprises a plurality of pylons for receiving the substrate thereon.

25. The housing of claim 24 wherein the other of the cover or the base has an elastomeric biasing member disposed thereon, the elastomeric biasing member acting against the substrate when the cover is conjoined to the base.

26. The housing of claim 21 wherein the pivot arrangement further comprises a groove formed in the cover, the groove in the cover also receiving a portion of the bead therein.

27. The housing of claim 1 wherein the pivot arrangement comprises a bead formed in the base and a corresponding groove disposed on the mounting member to receive the bead therein.

28. The housing of claim 27 wherein the pivot arrangement further comprises a bead formed on the cover, the groove in the mounting member also receiving the bead on the cover therein.

29. The housing of claim 27 wherein one of the cover or the base has a slot therein, further comprising:

a elastomeric board mount formed of an elastomeric, the board mount being disposed in a sealing relationship with the one of the base or the cover when the base and the cover are conjoined, and a substrate having a plurality of legs extending therefrom, the legs extending through the elastomeric board mount and projecting through the slot when the base and the cover are conjoined, the elastomeric material of the board mount forming a seal about the legs.

30. The housing of claim 29 wherein the board mount further comprises a plurality of pylons for receiving the substrate thereon.

31. The housing of claim 30 wherein the other of the cover or the base has an elastomeric biasing member disposed thereon, the elastomeric biasing member acting against the substrate when the cover is conjoined to the base.

32. The housing of claim 29 wherein the other of the cover or the base has an elastomeric biasing member disposed thereon, the elastomeric biasing member acting against the substrate when the cover is conjoined to the base.

33. The housing of claim 1 wherein the pivot arrangement comprises a bead formed in the cover and a corresponding groove disposed on the mounting member to receive the bead therein.

34. The housing of claim 1 wherein one of the cover or the base has a slot therein, further comprising:

a board mount formed of an elastomeric material, the board mount being disposed in a sealing relationship with the one of the base or the cover when the base and the cover are conjoined, and a substrate having a plurality of legs extending therefrom, the legs extending through the elastomeric board mount and projecting through the slot when the base and the cover are conjoined, the elastomeric material of the board mount forming a seal about the legs.

35. The housing of claim 34 wherein the board mount further comprises a plurality of pylons for receiving the substrate thereon.

36. The housing of claim 34 wherein the other of the cover or the base has an elastomeric biasing member disposed thereon, the elastomeric biasing member acting against the substrate when the cover is conjoined to the base.

37. The housing of claim 1 wherein the pivot arrangement comprises a bead disposed on the mounting member and a corresponding groove formed in the cover to receive the bead therein.

38. The housing of claim 35 wherein the other of the cover or the base has an elastomeric biasing member disposed thereon, the elastomeric biasing member acting against the substrate when the cover is conjoined to the base.

* * * * *